United States Patent
Yamada et al.

(10) Patent No.: US 8,932,954 B2
(45) Date of Patent: Jan. 13, 2015

(54) IMPURITY ANALYSIS DEVICE AND METHOD

(75) Inventors: Yuji Yamada, Yokohama (JP); Makiko Katano, Yokohama (JP); Chikashi Takeuchi, Yokohama (JP); Tomoyo Naito, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 335 days.

(21) Appl. No.: 13/593,563

(22) Filed: Aug. 24, 2012

(65) Prior Publication Data

US 2013/0244349 A1 Sep. 19, 2013

(30) Foreign Application Priority Data

Mar. 15, 2012 (JP) .................. 2012-058918

(51) Int. Cl.
*H01L 21/311* (2006.01)
*H01L 21/31* (2006.01)
*H01L 21/469* (2006.01)

(52) U.S. Cl.
USPC ............. 438/694; 438/14; 438/502; 438/509; 438/783; 438/799; 257/E21.529; 257/E21.283

(58) Field of Classification Search
None
See application file for complete search history.

(56) References Cited

U.S. PATENT DOCUMENTS

| 5,686,314 | A | 11/1997 | Miyazaki | |
| 6,140,247 | A * | 10/2000 | Muraoka et al. | 438/743 |
| 6,164,133 | A | 12/2000 | Watanabe | |
| 6,541,354 | B1 * | 4/2003 | Shimoda et al. | 438/478 |

FOREIGN PATENT DOCUMENTS

| JP | 5-90378 | 4/1993 |
| JP | 7-229864 | 8/1995 |
| JP | 9-145569 | 6/1997 |
| JP | 11-83704 | 3/1999 |
| JP | 11-166882 | 6/1999 |
| JP | 2001-343339 | 12/2001 |
| JP | 2004-205330 | 7/2004 |

OTHER PUBLICATIONS

G. Vereecke et al., "Analysis of Trace Metals in Silicon Nitride Films by a Vapor Phase Decomposition-Solution Collection Approach," Electrochemical Society Proceedings, vol. 99-16, p. 139-146 (1999).

* cited by examiner

*Primary Examiner* — Mohsen Ahmadi
(74) *Attorney, Agent, or Firm* — Finnegan, Henderson, Farabow, Garrett & Dunner, L.L.P.

(57) ABSTRACT

According to one embodiment, an impurity analysis method comprises performing vapor-phase decomposition on a silicon-containing film formed on a substrate, heating the substrate at a first temperature after vapor phase decomposition, heating the substrate at a second temperature higher than the first temperature after heating at the first temperature, to remove a silicon compound deposited on the surface of the silicon-containing film, dropping a recovery solution onto the substrate surface after heating at the second temperature and moving the substrate surface, to recover metal into the recovery solution, and drying the recovery solution, to perform X-ray fluorescence spectrometry on a dried mark.

18 Claims, 3 Drawing Sheets

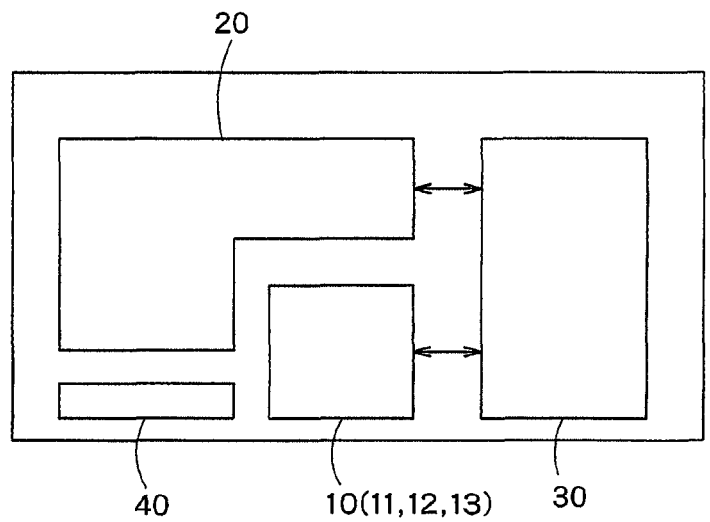
F I G. 1
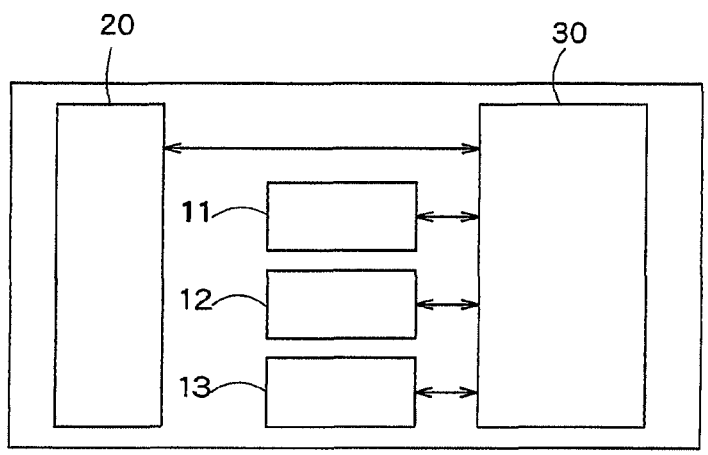
F I G. 2

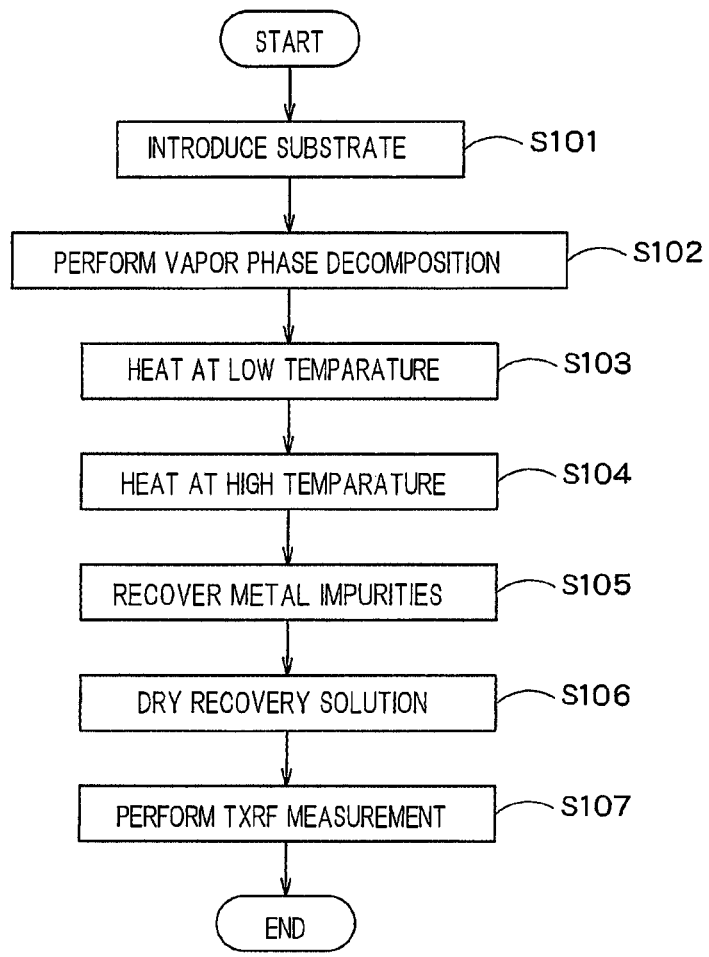
F I G. 3

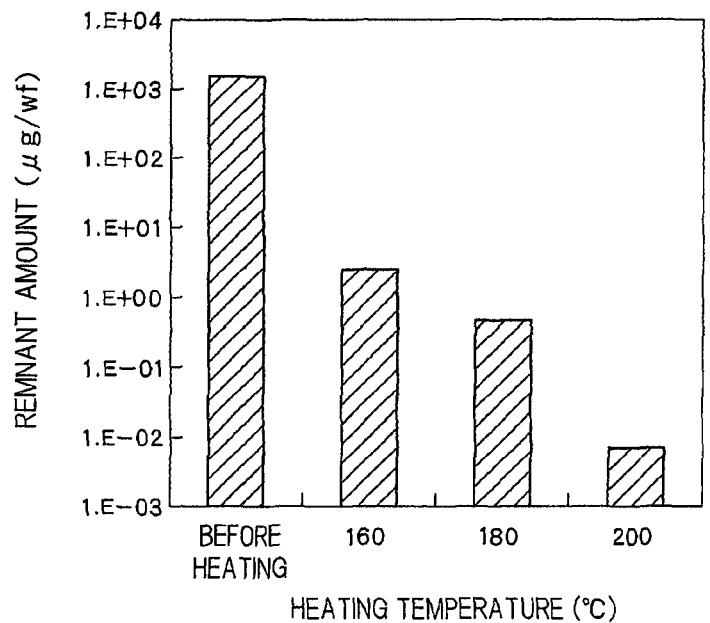
F I G. 4
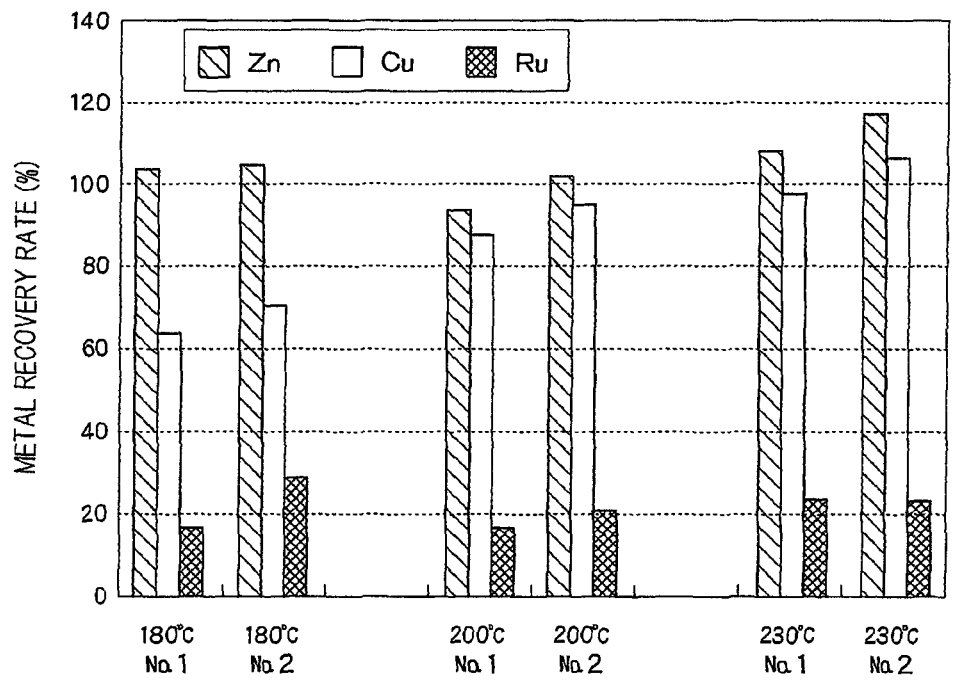
F I G. 5

IMPURITY ANALYSIS DEVICE AND METHOD

CROSS REFERENCE TO RELATED APPLICATION

This application is based upon and claims benefit of priority from the Japanese Patent Application No. 2012-58918, filed on Mar. 15, 2012, the entire contents of which are incorporated herein by reference.

FIELD

Embodiments described herein relate generally to an impurity analysis device and an impurity analysis method.

BACKGROUND

Metallic impurities present in a semiconductor thin film bring about degradation of withstand pressure of an oxide film and a crystal defect, to cause deterioration in semiconductor device characteristics. For this reason, in a device manufacturing process, analysis of impurities has been performed.

For example, when an object to be inspected is a native oxide film or an oxide film with a film thickness of smaller than 10 nm on a semiconductor substrate, the oxide film is decomposed by vapor phase decomposition using hydrofluoric acid, and a chemical solution is dropped onto the substrate having become hydrophobic, which is then scanned, to recover metallic impurities on the substrate into the chemical solution. Then, this chemical solution is directly analyzed by an Inductively Coupled Plasma Mass Spectrometry (hereinafter referred to as ICP-MS) spectrometer, or this chemical solution is dried on the substrate and analyzed by a Total-reflection X-Ray Fluorescence (hereinafter referred to as TXRF) spectrometer.

When the object to be inspected is an oxide film or a nitrogen-containing thin film with a thickness of 10 nm or more, a large amount of Si atoms remain in the chemical solution having recovered the metallic impurities by the foregoing method. The SI atoms remaining in this chemical solution make it difficult to perform metallic impurity analysis in a low concentration by use of the TXRF spectrometer. Further, in the case of performing analysis by use of the ICP-MS spectrometer after pretreatment of removing the SI atoms in the chemical solution, unintended mixture of contamination from a reagent, an environment or a container used in the pretreatment makes it difficult to perform metallic impurity analysis in a low concentration. Moreover, such pretreatment is performed by an operator and thus makes it difficult to perform rapid analysis at low cost, which has been problematical.

BRIEF DESCRIPTION OF THE DRAWINGS

FIG. 1 is a plan view of an impurity analysis device according to the present embodiment;

FIG. 2 is a front view of the impurity analysis device according to the present embodiment;

FIG. 3 is a flowchart explaining an impurity analysis method according to the present embodiment;

FIG. 4 is a graph showing a relation between a heating temperature and a remnant amount of a residue; and FIG. 5 is a graph showing a relation between the heating temperature and a metal recovery rate.

DETAILED DESCRIPTION

According to one embodiment, an impurity analysis method comprises performing vapor-phase decomposition on a silicon-containing film formed on a substrate, heating the substrate at a first temperature after vapor phase decomposition, heating the substrate at a second temperature higher than the first temperature after heating at the first temperature, to remove a silicon compound deposited on the surface of the silicon-containing film, dropping a recovery solution onto the substrate surface after heating at the second temperature and moving the substrate surface, to recover metal into the recovery solution, and drying the recovery solution, to perform X-ray fluorescence spectrometry on a dried mark.

Embodiments will now be explained with reference to the accompanying drawings.

FIG. 1 is a plan view (transverse sectional view) of an impurity analysis device according to the present embodiment, and FIG. 2 is a front view (vertical sectional view) of the impurity analysis device.

As shown in FIGS. 1 and 2, the impurity analysis device is provided with a pretreatment unit 10 having a vapor phase decomposition section 11, a heating section 12 and a sample recovery section 13, an X-ray fluorescence spectrometer 20 that applies X-rays to perform analysis of an object to be measured on a substrate, and a carrier unit 30 that carries the substrate. Further, the impurity analysis device is provided with a control section 40 that controls each section of the impurity analysis device.

The X-ray fluorescence spectrometer 20 is, for example, a Total-reflection X-Ray Fluorescence (TXRF) spectrometer that analyzes metal contamination on the substrate surface through use that X-rays are irradiated on the substrate surface with an extremely low angle and the X-rays are totally reflected on the substrate surface.

The carrier unit 30 has a robot hand, and carries the substrate among the vapor phase decomposition section 11, the heating section 12, the sample recovery section 13 and the X-ray fluorescence spectrometer 20.

The vapor phase decomposition section 11 dissolves metallic impurities present in the film of the substrate surface by use of reactive gas, and holds the impurities on the substrate surface. The vapor phase decomposition section 11 is, for example, provided with a PTFE-made casing, and can carry the substrate in and out by means of the carrier unit 30. As for the reactive gas, for example, a hydrofluoric acid vapor is employed. Upon introduction of the reactive gas into the casing, the oxide film or a nitride film formed on the substrate surface are dissolved, and an object to be measured (metallic impurities) present on the surface of the film or in the film are also dissolved. Further, the vapor phase decomposition section 11 is made capable of purging the reactive gas by introducing inert gas such as nitrogen.

The heating section 12 heats and dries the substrate. The heating section 12 is, for example, provided with a PTFE-made casing, and can carry the substrate in and out by means of the carrier unit 30. A hot plate is provided inside the casing of the heating section 12, and the substrate is placed on the hot plate and heated. The hot plate may be a larger one or a smaller one than the substrate. A temperature for heating by the hot plate is controlled by the control section 40.

The sample recovery section 13 drops a recovery solution onto the surface of the substrate, and moves the solution to the center of the substrate while holding and rotating the substrate by a rotation holding section, to recover the object to be measured (metallic impurities) present on the substrate surface. A heating means such as a lamp is provided inside the sample recovery section 13, and heats the solution having recovered the object to be measured, to dry the object to be measured.

Next, an impurity measuring method according to the present embodiment will be described using of the flowchart shown in FIG. 3. The impurity measuring device shown in FIGS. 1 and 2 is used for measuring impurities.

(Step S101) For example, a substrate with a diameter of 300 mm formed with a silicon nitride film with a film thickness of 200 nm is Introduced into the vapor phase decomposition section 11 of the impurity analysis device.

(Step S102) A hydrofluoric acid vapor is supplied into the vapor phase decomposition section 11, and the silicon nitride film on the substrate is decomposed over about 10 hours. After decomposition of the silicon nitride film, nitrogen gas is supplied for about 10 minutes, to purge the gas inside the vapor phase decomposition section 11. By decomposition of the silicon nitride film, a large amount of silicon compound is deposited on the substrate.

(Step S103) The substrate is carried to the heating section 12, and placed on the hot plate. Then, the substrate (entire surface) is heated on the hot plate, heated to about 110° C., for about 10 minutes. Thereby, a droplet (decomposed silicon nitride film) on the substrate is dried.

(Step S104) The temperature of the hot plate is raised to about 230° C., and the heating is further performed for about 5 minutes. Thereby, a decomposed residue (silicon compound deposited in Step S102) on the substrate is removed.

(Step S105) After cooling of the substrate, the substrate is carried to the sample recovery section 13 and held in the rotation holding section. Then, 0.1 ml of a recovery solution is dropped onto the substrate, and the entire surface of the substrate is scanned, to recover metallic impurities on the substrate into the recovery solution. For example, a mixed solution containing 2% of hydrofluoric acid and 2% of a hydrogen peroxide solution is used as the recovery solution. In the case of recovering metallic impurities having low recovery efficiency with the mixed solution of hydrofluoric acid and the hydrogen peroxide solution, a mixed solution of hydrochloric acid and the hydrogen peroxide solution can be used as the recovery solution.

(Step S106) The recovery solution having dissolved the metallic impurities is moved to the center of the substrate. The recovery solution is then dried by heating the lamp, to obtain a dried mark.

(Step 107) The substrate is carried to the X-ray fluorescence spectrometer 20, and TXRF measurement is performed on a position of the dried mark where the metallic impurities are concentrated.

In the present embodiment, a low-temperature heating is performed in Step S103, and a high-temperature heating is performed in Step S104. When the droplet on the substrate bumps, the metallic impurities may be scattered, and hence heating is performed at a temperature equal to or lower than a boiling point of the droplet in Step S103. For example, in this case, since the droplet is bumped when heated at 120° C. or higher, the heating temperature in Step S103 is preferably lower than 120° C.

In Step S104, the high-temperature heating is performed for removing the decomposed residue (silicon compound). Although a heating temperature and heating time are set as appropriate depending on the kind and a film thickness of a semiconductor thin film to be decomposed, the metallic impurities in the semiconductor thin film tend to be diffused inside the substrate when those are elements such as Cu which tend to be diffused in a Si crystal, and the impurities tend to be vaporized when those are elements such as Ru whose oxides have low vapor pressure, and hence the heating is preferably performed in a short period of time. Further, the heating temperature needs to be set equal to or lower than a heat-resistant temperature of a constituent material for the casing of the heating section 12. For example, when the casing of the heating section 12 is made of PTFE, the heating temperature is limited to 240° C. or lower.

FIG. 4 shows a relation between the heating temperature and a remnant amount of the residue at the time of removing the decomposed residue in Step S104. The remnant amount was represented by an ammonium ion amount obtained by pure water-extraction ion chromatography with the substrate after heating. It is found from FIG. 4 that setting the heating temperature to 180° C. or higher enables removal of 99.9% or more of the decomposed residue.

FIG. 5 shows a relation between the heating temperature and a recovery rate of the metallic impurities in the silicon nitride film in Step S104. A silicon nitride film with a film thickness of 200 nm was formed on a substrate with a diameter of 300 mm, and this silicon nitride film was intentionally contaminated with 4 ng of each of Zn, Cu and Ru. The heating temperature and the heating time were 180° C. for 90 minutes, 200° C. for 15 minutes and 230° C. for 5 minutes, and with respect to each of them, tests were conducted twice.

As shown from FIG. 5, Zn could be recovered about 100% without depending on the heating temperature. The recovery rate of Cu improved with increase in heating temperature. There was almost no difference in recovery rate of Ru due to the heating temperature. It is found from this result that the recovery rate of the metallic impurities improves more when the heating temperature is higher in Step S104 especially in the case of Cu being contained.

As thus described, in the present embodiment, the substrate is heated after decomposition of the silicon nitride film and before recovery of the metallic impurities, to remove the decomposed residue (silicon compound).

Comparative Example

An impurity analysis method by a comparative example will be described. An impurity analysis method according to a comparative example is one obtained by omitting Steps S103 and S104 from the impurity measuring method according to the above embodiment shown in FIG. 3.

When the removal of the decomposed residue in Steps S103 and S104 is not performed, at the time of recovering the metallic impurities in Step S105, the silicon compound is dissolved into the recovery solution to saturate a concentration of the recovery solution, thus increasing metallic impurities not dissolved into the recovery solution. Further, when the recovery solution where the silicon compound is dissolved is dried, a large volume of dried mark is formed to increase an intensity of scattered rays at the time of the TXRF measurement, thus making accurate TXRF measurement impossible. This generates the need to change parameters and start over the measurement of the impurities, thereby to increase the time and cost for the analysis.

On the other hand, according to the present embodiment, since the substrate is heated after decomposition of the silicon nitride film and before recovery of the metallic impurities to remove the decomposed residue (silicon compound), it is possible to efficiently dissolve the metallic impurities into the recovery solution. Further, it is possible to prevent the decomposed residue from having an effect on the TXRF measurement, so as to perform the TXRF measurement in an accurate and rapid manner at low cost.

Although the heating section 12 and the vapor phase decomposition section 11 were separately installed in the above embodiment, the heating section 12 may be provided inside the vapor phase decomposition section 11. With the heating section 12 provided inside the vapor phase decomposition section 11, it is possible to prevent deterioration in efficiency to remove the decomposed residue due to that the droplet on the substrate containing metal contamination drops and disappears therefrom or the droplets gather to grow to a large droplet at the time of carrying the substrate.

In the above embodiment, there are cases where the surface of the substrate becomes hydrophilic depending on the heating temperature and the heating time in Steps S103 and S104, to make it difficult to scan the recovery solution on the substrate in Step S105. In this case, it is preferable, between Step S104 and S105, to carry the substrate to the vapor phase decomposition section 11 again and supply the hydrofluoric acid vapor for a short period of time for decomposing a native oxide film on the substrate, so as to give a hydrophobic surface.

Although the example was described in the above embodiment where the silicon nitride film is formed on the substrate, the present embodiment is useful for a case where a film to be tested deposits a large amount of silicon compound by decomposition, and for example, a silicon oxide film with a large film thickness (film thickness of 10 nm or more) may be formed.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. An impurity analysis method, comprising:
   performing vapor-phase decomposition on a silicon-containing film formed on a substrate;
   heating the substrate at a first temperature after vapor phase decomposition;
   heating the substrate at a second temperature higher than the first temperature after heating at the first temperature, to remove a silicon compound deposited on the surface of the silicon-containing film;
   dropping a recovery solution onto the substrate surface after heating at the second temperature and moving the substrate surface, to recover metal into the recovery solution; and
   drying the recovery solution, to perform X-ray fluorescence spectrometry on a dried mark;
   wherein a hydrofluoric acid vapor is supplied to the substrate surface after heating at the second temperature and before dropping of the recovery solution, to make the substrate surface hydrophobic.

2. The impurity analysis method according to claim 1, wherein the second temperature is 180° C. or higher and 240° C. or lower.

3. The impurity analysis method according to claim 1, wherein the first temperature is lower than 120° C.

4. The impurity analysis method according to claim 1, wherein the silicon-containing film is subjected to vapor phase decomposition by use of a hydrofluoric acid vapor.

5. The impurity analysis method according to claim 1, wherein the second temperature is 200° C. or higher and 240° C. or lower, and the metal include copper.

6. The impurity analysis method according to claim 1, wherein the silicon-containing film is a silicon nitride film.

7. The impurity analysis method according to claim 1, wherein the silicon-containing film is a silicon oxide film with a film thickness of 10 nm or more.

8. The impurity analysis method according to claim 1, wherein the recovery solution includes hydrofluoric acid and a hydrogen peroxide solution.

9. The impurity analysis method according to claim 1, wherein the recovery solution includes hydrochloric acid and a hydrogen peroxide solution.

10. An impurity analysis device, comprising:
    a vapor phase decomposition section configured to perform vapor phase decomposition on a silicon-containing film formed on a substrate;
    a heating section configured to heat the substrate at a first temperature, and then heat the substrate at a second temperature higher than the first temperature;
    a recovery section configured to drop a recovery solution onto the substrate surface and move the substrate surface, to recover the metal into the recovery solution; and
    an X-ray fluorescence spectrometry section configured to perform X-ray fluorescence spectrometry on a dried mark obtained by drying the recovery solution;
    wherein the vapor phase decomposition section supplies reactive gas to perform vapor phase decomposition on the silicon-containing film and an inert gas to purge the reactive gas.

11. The impurity analysis device according to claim 10, wherein the heating section is provided in the vapor phase decomposition section.

12. The impurity analysis device according to claim 10, wherein the vapor phase decomposition section has a PTFE-made casing.

13. The impurity analysis device according to claim 10, wherein the heating section has a PTFE-made casing.

14. The impurity analysis device according to claim 13, wherein the second temperature is 180° C. or higher and 240° C. or lower.

15. The impurity analysis device according to claim 10, wherein the first temperature is lower than 120° C.

16. The impurity analysis device according to claim 10, wherein the recovery section is provided with a heating means for drying the recovery solution having recovered metal.

17. The impurity analysis device according to claim 10, wherein the recovery solution contains hydrofluoric acid and a hydrogen peroxide solution.

18. The impurity analysis device according to claim 10, wherein the recovery solution contains hydrochloric acid and a hydrogen peroxide solution.

* * * * *